United States Patent [19]

Banerjee et al.

[11] Patent Number: 4,728,406

[45] Date of Patent: Mar. 1, 1988

[54] METHOD FOR PLASMA - COATING A SEMICONDUCTOR BODY

[75] Inventors: Arindam Banerjee, Madison Heights; Prem Nath, Rochester; Herbert C. Ovshinsky, Oak Park, all of Mich.

[73] Assignee: Energy Conversion Devices, Inc., Troy, Mich.

[21] Appl. No.: 897,246

[22] Filed: Aug. 18, 1986

[51] Int. Cl.⁴ .......................................... C23C 14/34
[52] U.S. Cl. .................... 204/192.29; 204/192.15; 204/192.26; 427/39; 427/255
[58] Field of Search .................. 204/192.12, 192.15, 204/192.22, 192.26, 192.27, 192.28, 192.29, 298; 427/39, 255, 255.7

[56] References Cited

U.S. PATENT DOCUMENTS

| | | | |
|---|---|---|---|
| 4,041,477 | 8/1977 | Drenckhan | 204/192.26 X |
| 4,124,474 | 11/1978 | Bomchil et al. | 204/298 X |
| 4,162,505 | 7/1979 | Hanak | 204/192.29 X |
| 4,395,323 | 7/1983 | Denton et al. | 204/298 |
| 4,400,254 | 8/1983 | Freller et al. | 204/192.29 |
| 4,426,275 | 1/1984 | Meckel et al. | 204/298 |
| 4,427,524 | 1/1984 | Crombeen et al. | 204/298 |
| 4,448,659 | 5/1984 | Morrison, Jr. | 204/298 X |
| 4,572,842 | 2/1986 | Dietrich et al. | 204/298 X |
| 4,620,913 | 11/1986 | Bergman | 204/298 X |

*Primary Examiner*—John F. Niebling
*Assistant Examiner*—Nam X. Nguyen
*Attorney, Agent, or Firm*—Marvin S. Siskind; Richard M. Goldman

[57] ABSTRACT

A method for the plasma coating of a layer of material atop a semiconductor body, said method and apparatus adapted to substantially prevent damage to the semiconductor body by energetic vaporized species developed during the coating process. The invention has particular utility in the high volume fabrication of thin film semiconductor devices and may be readily adapted to provide the transparent conductive electrode of photoresponsive devices in a continuous roll-to-roll deposition process.

16 Claims, 4 Drawing Figures

METHOD FOR PLASMA - COATING A SEMICONDUCTOR BODY

FIELD OF THE INVENTION

This invention relates generally to methods and apparatus for the fabrication of semiconductor devices of the type which include a layer of material, such as a layer of transparent, electrically conductive material electrically communicating with and in superposed relationship to a semiconductor body. More particularly, the present invention can provide for the high rate deposition of transparent, conductive material upon a photoresponsive device in a manner which prevents damage to the semiconductor body thereof by energetic vaporized species developed during the deposition process. The method and apparatus of the instant invention are readily adaptable to continuous roll-to-roll deposition processes, and are particularly suited for the manufacture of thin film semiconductor devices such as photovoltaic devices, photosensors, liquid crystal display devices and the like. The invention, as disclosed herein, is most specifically adapted for use in the manufacture of large area, thin film photovoltaic devices, insofar as it provides for the fabrication of the transparent electrode of the photovoltaic device at relatively high rates of speed without causing damage to the subjacent thin film semiconductor layers.

BACKGROUND OF THE INVENTION

Single crystal photovoltaic devices, especially silicon photovoltaic devices, have been utilized for some time as sources of electrical power because they are inherently non-polluting, silent and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

It is now possible to prepare by glow discharge or other vapor deposition techniques, thin film amorphous silicon or germanium based alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," of Stanford R. Ovshinsky and Arun Madan which issued Oct. 7, 1980 and in U.S. Pat. No. 4,217,374, under the same title, which issued on Aug. 12, 1980, to Stanford R. Ovshinky and Masatsugu Izu, and in U.S. Pat. No. 4,504,518 of Stanford R. Ovshinsky, David D. Allred, Lee Walter and Stephen J. Hudgens entitled "Method of Making Amorphous Semiconductor Alloys and Devices Using Microwave Energy," which issued on Mar. 12, 1985, and in U.S. Pat. No. 4,517,223 under the same title which issued on May 14, 1985 to Stanford R. Ovshinsky, David D. Allred, Lee Walter and Steven J. Hudgens, the disclosures of which are incorporated herein by reference. As disclosed in these patents, it is believed that fluorine introduced into the body of amorphous semiconductor alloy material operates to substantially reduce the density of the localized states therein and facilitates the addition of other alloying materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon and germanium alloys can be deposited in multiple layers over large area substrates to form semiconductor devices such as solar cells in a high volume, continuous processing system. Such continuous processing systems are disclosed in the following U.S. Pat. Nos. 4,400,409, for A Method of Making P-Doped Silicon Films And Devices Made Therefrom; 4,410,588, for Continuous Amorphous Solar Cell Deposition And Isolation System And Method; 4,542,711, for Continuous Systems For Depositing Amorphous Semiconductor Material; 4,492,181 for Method And Apparatus For Continuously Producing Tandem Amorphous Photovoltaic Cells; and 4,485,125 for Method And Apparatus For Continuously Producing Tandem Amorphous Photovoltaic Cells. As disclosed in these patents, the disclosures of which are incorporated herein by reference, a substrate may be continuously advanced through a succession of deposition chambers, wherein each chamber is dedicated to the deposition of a specific semiconductor material. For example, in making a solar cell of n-i-p type configuration, the first chamber is dedicated for depositing a n-type amorphous silicon alloy, the second chamber is dedicated for depositing an intrinsic amorphous silicon alloy, and the third chamber is dedicated for depositing a p-type amorphous silicon alloy.

The layers of thin film semiconductor alloy material thus deposited in the vacuum envelope of the deposition apparatus may be utilized to form a photovoltaic device including one or more p-i-n cells, one or more n-i-p cells, a Schottky barrier, as well as photodiodes, phototransistors, other photosensors, memory arrays, display devices or the like. Additionally, by making multiple passes through the succession of deposition chambers, or by providing an additional array of deposition chambers, multiple stacked photovoltaic cells or other semiconductor devices of various configurations may be fabricated.

Following the deposition of the layers of semiconductor alloy material upon the substrate, a further deposition process must be performed either in a separate environment or as a part of a continuous process. In this step a thin, transparent or semi-transparent layer of electrically conductive, light transmissive material comprised of, for example, an alloy of indium, tin and oxygen (ITO) or indium and oxygen (IO), is deposited atop the layers forming the body of semiconductor alloy material. In the case of photovoltaic cells or photosensors, this transparent, conductive layer forms one of the electrodes thereof. It is the process of and apparatus for depositing such a thin, conductive, transmissive layer in superposed electrical communication with a body of semiconductor material, to which the present invention is primarily directed.

There are a wide variety of such transparent conductive materials having utility in the fabrication of semiconductor devices, such as photovoltaic cells. Generally speaking, materials such as degenerate semiconductors, wide band gap semiconductors, thin metallic films and cermets may be utilized to form the transparent conductive layer. Among some of the specific materials which may be utilized are indium oxide, tin oxide, indium tin oxide, cadmium oxide, cadmium stannate, zinc oxide, silicon carbide and various combinations thereof. It is to be understood that other transparent conductive materials may also be utilized in the practice of the instant invention. While the description herein will primarily be concerned with the deposition of thin, transparent, electrically conductive materials upon subjacent layers of semiconductor alloy material as a step in the fabrication of photovoltaic devices, it should be understood that such transparent conductive films also have utility in other electronic devices such as liquid crystal displays, photosensors, light emitting diodes, photochromic and electrochromic devices and the like. Furthermore, it should be clearly understood that the instant invention may be employed in any instance where the fabrication of a semiconductor device necessitates the plasma coating of a layer of material atop a semiconductor body which is prone to damage during the coating process.

There are a number of techniques utilized to deposit layers of transparent conductive material atop semiconductor bodies. Vacuum evaporation is one such technique. A typical vacuum evaporation process is carried out in a chamber maintained within a pressure regime substantially below atmospheric, typically in the range of $10^{-3}$ to $10^{-6}$ Torr. A charge of the material to be evaporated is placed into a crucible and heated by resistance, induction or electron beam bombardment to produce a vapor thereof, which vapor condenses upon the semiconductor body which is supported in close proximity to the crucible.

There are a number of variations of this typical vacuum evaporation process. For example, in a reactive evaporation process one component of the material being deposited is introduced as a gaseous reagent in the deposition chamber and the remaining components are charged into the crucible. A vapor phase reaction takes place with the product of that reaction depositing upon the substrate (such as the body of semiconductor alloy material). For example, one or more metals may be evaporated in the presence of oxygen to produce a transparent, conductive oxide film. In further variations of this process, electron beams, activated plasmas or other such energetic input may be used to facilitate the vapor phase reaction of the depositing species.

While vacuum evaporation techniques do have the advantage of being relatively simple, they are not always well suited for the commercial, high volume preparation of semiconductor devices. First of all, vacuum evaporation processes require relatively low pressures thus necessitating lengthy and complex pumping procedures. Furthermore, scale-up of a vacuum evaporation process from a research apparatus to a commercial scale, continuous production apparatus is relatively difficult because of the high degree of dependence of the process parameters upon the geometry of the deposition system. Furthermore, it has been found that in many applications evaporated coatings manifest poor adhesion with the underlying layers upon which they are deposited.

In contrast to vacuum evaporation, plasma processes such as sputtering, glow discharge, plasma activated evaporation and the like are fast, easy to control and scale-up, provide highly adherent coatings and consequently may be advantageously employed in the fabrication of layers of transparent conductive material. In a typical sputtering process, a d.c. or radio frequency signal is employed to generate ions from a working gas maintained at a pressure of typically $10^{-3}$ torr. Such ions are strongly attracted to, and consequently bombard, an electrically biased target (also referred to as a cathode), thereby ejecting particles of the target material, which particles deposit onto the exposed surface of a substrate maintained in close proximity thereto. In the preparation of a layer of indium tin oxide for example, the face of the target or cathode is a body of solid indium tin oxide material. A working gas, typically argon, is ionized and attracted to the target. The energetic impingement of the argon ions ejects small particles of the indium tin oxide material from the target, which particles condense upon the exposed surface of a semiconductor layer disposed upon a substrate. There are numerous variations of this basic sputtering process, such as magnetron sputtering in which a magnetic field associated with the target is utilized to enhance the efficiency of the process. In another notable variation, referred to as reactive sputtering, a post ejection reaction of the particles from the surface of the cathode with the gaseous atmosphere in the sputtering apparatus occurs so as to provide a new material therefrom, which material then condenses upon the substrate. For example, a target of an indium-tin alloy may be sputtered in an atmosphere of oxygen to provide a coating of indium tin oxide.

In a typical glow discharge deposition process, a gaseous reagent is introduced into a low pressure environment and subjected to electromagnetic energy so as to create an activated plasma therefrom. In this plasma, the gaseous reagent mixture reacts to form species which subsequently deposit on a substrate maintained within the low pressure environment. In an activated evaporation, vapor of a coating material is subjected to an energetic input so as to create a plasma therefrom for facilitating creation and maintenance of desirable coating species. It should be noted that there are a wide variety of plasma coating processes known and available to those skilled in the art and the instant invention, as will be detailed hereinbelow, may be employed in conjunction with any such process wherein it is desired to protect a body of semiconductor alloy material from damage due to the energetic impact thereupon of depositing species.

As mentioned hereinabove, plasma processes are attractive for use in the deposition of thin layers of transparent, electrically conductive material in the manufacture of electronic devices because such processes are easy to control, can achieve high deposition rates and may be readily scaled-up for large volume production. However, the use of such sputter coating or other plasma processes has often been found to result in damage to semiconductor layers upon which the coating material is being deposited. Such damage decreases the efficiency or other operational parameters of the electronic devices and in some instances can render them completely inoperative. Damage during plasma coating results from the energetic impingement of ionic or other energetic species upon the semiconductor layers of the substrate. Such bombardment can produce mechanical damage to the semiconductor layers, which damage is manifest as broken chemical bonds, vacancies in the matrix of the semiconductor material, and/or over-or-under-coordinated valencies in atoms from which the semiconductor alloy material is formed. In other instances, the ions impinging upon the semiconductor layer are reactive species themselves and as such partially denature the semiconductor layer; for example, oxygen or nitrogen ions can produce oxide or nitride species in the host matrix of the semiconductor alloy material thereby dramatically changing its optical, chemical and electrical properties. In other instances, reactive ions can create an interfacial layer between the depositing layer and the semiconductor layer, thereby limiting good electrical contact of the deposited layer with the semiconductor body.

In general, mechanical damage to or the chemical reaction occasioned by ions or other energetic species depositing upon the body of semiconductor alloy material produces defect states in the semiconductor body, which defect states may adversely affect the operation of the device being fabricated therefrom. For example, it has been found that when a layer of indium tin oxide is sputter coated onto a body of amorphous silicon or amorphous germanium alloy layers for forming a photovoltaic device, such layers will be damaged due to the sputtering process. It has been found that in some instances this damage may be mitigated by employing a very slow rate sputtering process; however, a slow process is impractical in commercial scale production. Accordingly, there is a need for a process for the high deposition rate sputtering of thin film materials onto semiconductor layers, which process does not occasion damage to those layers.

There is a great need for high deposition rate plasma coating processes which do not damage underlying semiconductor layers. The instant invention meets this need by providing protective means in a coating system, for preventing damage to the underlying layers of semiconductor alloy material, thereby allowing for the hiqh deposition rate coating thereof. Such a process may be readily adapted for the high deposition rate plasma coating of a wide variety of materials, as a step in the fabrication of photovoltaic devices, photosensors, imaging devices, display devices and other opto-electronic devices. The instant invention thus makes possible large scale, high yield, commercial production of a wide variety of semiconductor devices.

These and other advantages of the instant invention will be apparent from the brief description, the drawings and the detailed description thereof which follow.

BRIEF SUMMARY OF THE INVENTION

There is disclosed herein a method of manufacturing a semiconductor device of the type including a layer of transparent, electrically conductive material disposed in electrical communication with and superposed relationship to a body of semiconductor material. The method includes the steps of providing the semiconductor body; providing protective means adapted to substantially prevent damage to the semiconductor body by energetic vaporized species as the transparent conductive material is deposited, and the further step of plasma coating the transparent conductive material atop the semiconductor body. Through the use of the instant invention, the semiconductor body is protected from damage during the coating process and establishes a high quality electrical junction with the transparent conductive layer. In one embodiment, the protective means is adapted to minimize energetic impact of preselected ionic species upon the semiconductor body during the plasma coating of the layer of transparent conductive material.

In another embodiment of the instant invention the step of plasma coating the layer of transparent conductive material is a sputtering step which includes providing an energized sputtering target spacedly separated from the semiconductor body so that the target and the body define a vapor zone therebetween and the step of providing protective means includes disposing an electrically biased member in the vapor zone. In particular instances the biased member may be positively biased to minimize the energetic impact of negatively charged ions upon the semiconductor body. The positive biased member may be maintained for example, at a potential of fifty to one hundred volts. In one particular embodiment, the transparent, conductive coating is a layer of metallic oxide material and the step of providing means adapted to minimize ionic impact includes providing means adapted to minimize the energetic impact of oxygen ions upon the semiconductor body. The electrically biased member may comprise a screen-like, grid-like or ring-like member disposed in the vapor zone.

In yet another embodiment of the instant invention, the step of providing protective means comprises providing a thin layer of protective material atop the semiconductor body prior to the plasma coating of the transparent conductive layer thereupon. The protective layer may be deposited by an evaporation process, a plasma glow discharge deposition process, chemical vapor deposition process or, in some instances, a low energy, low deposition rate sputtering process. The protective layer may be formed of the same material as the transparent conductive layer or it may be a different material such as a degenerate semiconductor, an insulator, a wide band gap semiconductor, a cermet or various combinations thereof. Some materials having particular utility as protective layers are indium oxide, tin oxide, indium tin oxide, cadmium oxide, cadmium stannate, zinc oxide, magnesium fluoride, silicon carbide, and combinations thereof. In one embodiment of the instant invention, the protective layer is at least 20 angstroms thick.

The method of the instant invention may be readily adapted for a continuous deposition process by disposing the semiconductor body upon an elongated flexible web of substrate material and continuously advancing the substrate material through an apparatus having protective means and at least one plasma coating station therein.

The instant invention also includes apparatus for manufacturing semiconductor devices of the type includinq a layer of transparent, electrically conductive material in electrical communication with and superposed relationship to a body of semiconductor material. Such apparatus includes a plasma coating station adapted to deposit the layer of transparent electrically conductive material and protective means adapted to substantially prevent damage to the semiconductor body by energetic vaporized species as the transparent conductive material is deposited.

DETAILED DESCRIPTION OF THE DRAWINGS

I. The Photovoltaic Cell

Figure 1:
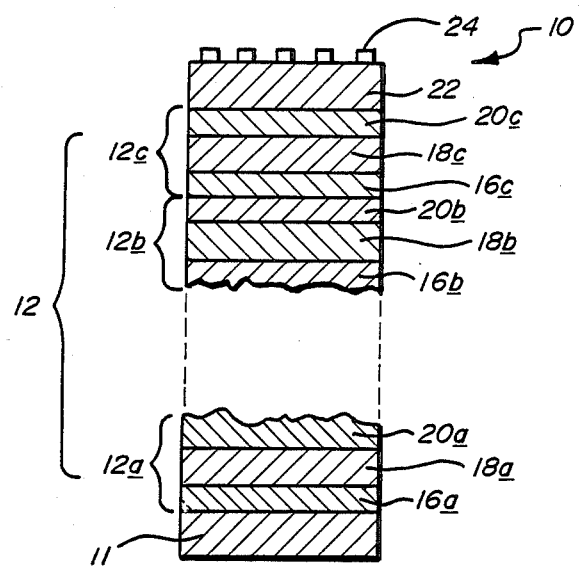
FIG. 1, is a partial cross-sectional view of a tandem n-i-p type photovoltaic device, said device including a layer of tranparent, electrically conductive material atop a semiconductor body, and said device being illustrative of one type semiconductor device which may be advantageously fabricated utilizing the principles of the instant invention.

Referring now to the drawings and particularly to FIG. 1, a photovoltaic cell, formed of a plurality of successive n-i-p layers, each of which preferably includes a thin film semiconductor alloy, is shown generally by the reference numeral 10. While the present invention is adapted to be used in conjunction with the manufacture of this type of photovoltaic cell, its use is not limited solely to the fabrication of stacked n-i-p-type photovoltaic cells, but may be employed with equal advantage for the manufacture of Schottky or MIS (metal-insulator-semiconductor) type cells, the production of other types of thin-film semiconductor devices, or any device requiring the plasma deposition of a layer of material atop a semiconductor layer.

More particularly, FIG. 1 shows a tandem n-i-p-type photovoltaic device such as a solar cell including a semiconductor body 12, made up of individual n-i-p solar cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to the application of the semiconductor material, for the purpose of this application, the term substrate shall include not only a flexible film but also any elements added thereto by preliminary processing. In alternate preferred embodiments, the substrate may be formed of (1) glass or other such insulating material with an electrically-conductive coating applied onto one surface thereof; or (2) of synthetic plastic resins, with or without the application of conductive coatings thereto.

Each of the cells 12a, 12b and 12c include a semiconductor body containing, in one embodiment, at least a silicon alloy. Each of the semiconductor bodies preferably includes a p-type conductivity microcrystalline region or layer 20a, 20b or 20c; an intrinsic region or layer 18a, 18b or 18c; and an n-type conductivity microcrystalline region or layer 16a, 16b or 16c. As illustrated, cell 12b is an intermediate cell and, as indicated in FIG. 1, additional intermediate cells may be stacked atop the illustrated cells without departing from the spirit or scope of the present invention. Also, although stacked n-i-p cells are illustrated, this invention is equally adapted for single or stacked p-i-n cells. Whereas, in one preferred embodiment of the illustrated device, an amorphous semiconductor alloy, which includes fluorine, is used to form each of the layers of the cells 12, the layers could also be formed of crystalline or polycrystalline materials, with or without the addition of fluorine. The inventive concepts disclosed herein are applicable to all thin film semiconductor devices, regardless of materials or crystallinity.

Following the deposition of the semiconductor alloy layers, a further deposition step is performed. In this step, a highly electrically-conductive, highly light transmissive coating 22 is added atop the p-type layer 20c; which transparent, electrically-conductive coating may, for example, be a thin, approximately 550 angstrom thick film of indium tin oxide, cadmium stannate, indium oxide, zinc oxide, or tin oxide. The detailed description which follows, teaches improved processes of and apparatus for depositing such thin, conductive, transmissive coatings 22 onto a substrate, by a process which does not harm subajacent semiconductor layers.

Finally, an electrically conductive grid pattern 24 may be added to the top surface of the transparent, electrically-conductive coating 22 with an electrically conductive paste or an electroplated or evaporated metallic material. For a tandem cell having a sufficiently small area, the transparent conductive coating 22 is generally sufficiently conductive so the grid 24 is not necessary. However, if the cell is of a sufficiently large area, or if the conductivity of the coating 22 is insufficient, the grid 24 may be placed on the layer 22 to shorten the carrier path and increase the efficiency thereof.

II. Method and Apparatus for Depositing A Conductive, Transmissive Film

The principles of the instant invention may be embodied in a variety of methods and apparatus used in conjunction with the plasma deposition of thin films of materials such as transparent conductive materials, upon body of semiconductor alloy material. It is the essence of the instant invention that protective means is provided to substantially prevent damage to the semiconductor body due to its bomnardment by energetic vaporized species as a thin film coating of a material is deposited thereon. For purposes of illustration, the instant invention will be described with reference to a plurality of preferred sputtering embodiments, it being understood that these embodiments are merely illustrative of the general principles which may be practiced with equal advantage utilizing other plasma coating methods, apparatus and materials different from those specifically mentioned herein. The term "semiconductor body" as used herein is therefore meant to include layers, patterns or other structures of various semiconductor alloy materials as operatively disposed to have a layer of material sputter-coated thereupon.

Figure 2:
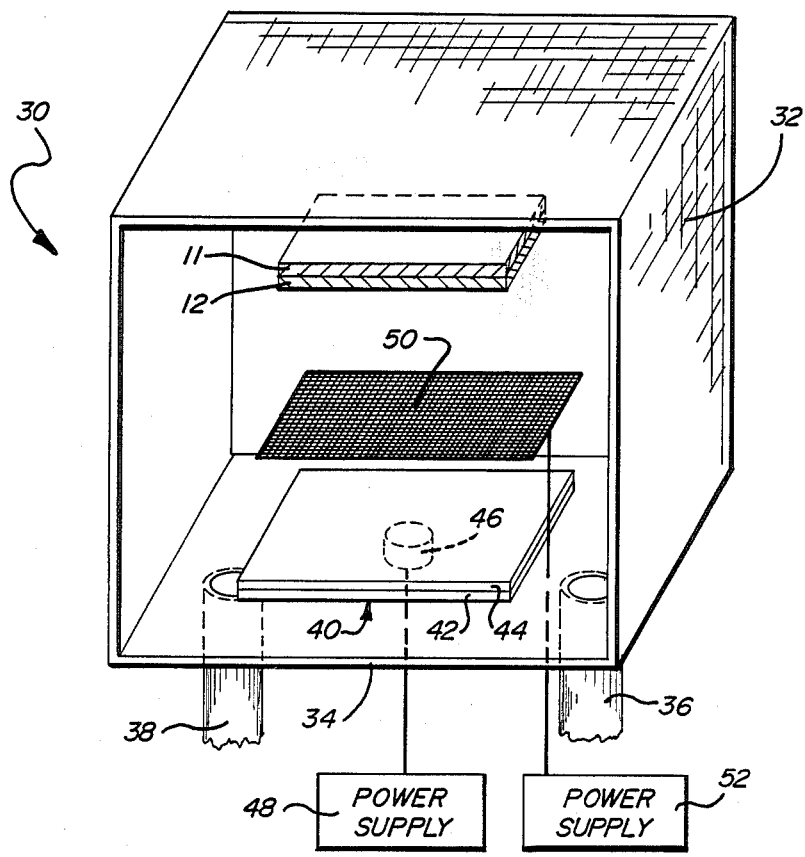
FIG. 2, is a stylized, perspective view of a plasma coating apparatus for coating a semiconductor body, said apparatus modified in accord with one preferred embodiment of the instant invention by the inclusion of a biased member adapted to minimize energetic impact of preselected ionic species upon the semiconductor body.

Referring now to FIG. 2, there is shown a stylized batch process sputter deposition apparatus 30 as adapted to practice the principles of the instant invention. The sputtering apparatus 30 is utilized to sputter coat a layer of transparent conductive oxide material, such as indium tin oxide, atop a semiconductor body 12 disposed upon a substrate 11, both said body and substrate being, in one embodiment, generally similar in structure and function to the device 10 described hereinabove with reference to FIG. 1.

The sputtering apparatus 30 is housed within a vacuum-tight deposition chamber 32, having a base plate 34, cooperating with the wall of the chamber 32 to provide a vacuum tight environment. The base plate 34 includes a gas inlet port 36 adapted to introduce one or more sputtering gases into the chamber 32. The base plate also includes an exhaust port 38 adapted to be connected to a vacuum pump, not shown, for purposes of maintaining a reduced pressure in the apparatus 30 during the sputtering process. The apparatus 30 further includes a sputtering target 40 with a metallic backing plate 42 having thereupon a facing layer 44, comprised of the material to be sputtered, in this case indium tin oxide. The sputtering target 40 is provided with a connector post 46, shown here in phantom outline, which post is adapted to mount the target in the apparatus and to establish electrical communication with a sputtering power supply 48.

In the operation of a typical sputtering process, as is well known to those skilled in the art, the chamber 32 is evacuated and maintained at a pressure substantially below atmospheric (i.e., typically $10^{-3}$ torr) via the exhaust port 38, and is provided with an atmosphere of a working gas, such as argon, through the gas inlet port 36. The sputtering target or cathode 40 is energized with electromagnetic energy from the power supply 48. This energy may be dc energy, or it may be ac energy of various frequencies. One typically employed frequency is 13.56 MHz. Depending upon the particular sputtering process employed, the substrate 11 may be grounded so as to maintain electrical neutrality, or it may be electrically insulated and allowed to "float" to a bias potential relative to the sputtering target 40. It should be understood that there are a wide variety of sputtering conditions and systems and the instant invention may be advantageously utilized with all of such processes.

The electromagnetic energy applied to the target 40 ionizes the working gas in proximity thereto and further acts to accelerate such gaseous ions into the facing layer 44 of the target 40. The energetic impact of the ions of the working gas operates to eject particles of the material comprising the facing layer 44 and these particles condense upon the exposed surface of the semiconductor body 12 disposed upon the substrate 11.

As has been discussed previously, this process is frequently damaging to the semiconductor layer because of the impact thereupon of energetic vaporized species. For example, in the sputtering of oxygen containing materials such as indium tin oxide, zinc oxide and the like, energetic oxygen ions are created and these ions can mechanically or chemically damage the semiconductor body 12. This damage may result from ionic impact which breaks bonds of the body of semiconductor alloy material; or, damage may result from the chemical reaction of the semiconductor material with oxygen ions. A wide variety of ionic species are created in a sputtering plasma and the full extent of their nature and interactions with the semiconductor body are not fully understood. However, it has been observed that the sputtering of materials onto a body of semiconductor alloy material, particularly thin film semiconductor alloy layers, frequently degrades or destroys the electrical characteristics of those materials; furthermore, it has been found that high deposition rate sputtering processes, typically those which are of the greatest commercial value produce the most severe damage to the underlying semiconductor layers. It is such damage which is substantially reduced, if not eliminated, by the instant invention.

As will be noted from FIG. 2, the apparatus 30 of the instant invention may further include a mesh-like electrode member 50 disposed in the vapor zone defined by the sputtering target 40 and the semiconductor body 12. This mesh like member 50 is electrically biased by a biasing power supply 52 electrically communicating therewith. By controlling the sign and magnitude of the bias upon the electrode member 50, energetic impact of preselected ionic species upon the semiconductor body 12 may be controlled.

For example, the electrode member 50 may be positively biased so as to control the impact of negatively charged oxygen ions upon the semiconductor body 12. The electrode member 50 may, for example, be biased to a positive value of approximately fifty to one hundred volts and will either collect the ions before they impact the substrate or will function to remove kinetic energy from the ions as they pass therepast, thus reducing the energetic impact of those ions on the substrate.

In those instances where the impact of positively charged ions is to be controlled, it may be advantageous to negatively bias the member 50. In still other instances, it may be desirable to provide the electrode member 50 with a bias of the same sign as the ions whose impact is being minimized. When operating in this mode, the biased member will function to repel like-charged ions from the region proximate the semiconductor body 12. Obviously, numerous modifications of this process will become readily apparent to a skilled routineer. For example, a pair of oppositely biased electrode members may be utilized to: (1) repel ions from the substrate and (2) collect those ions at another location. Although a grid-like mesh electrode is illustrated, other configurations such as a ring-shaped electrode, a cylindrical electrode, a plate-like electrode, a plurality of electrodes or the like may be utilized without departing from the spirit and scope of the instant invention.

It should further be appreciated that in a static or batch type system such as that illustrated, the electrode member 50 need not be maintained at a biased potential for the entirety of the sputtering process insofar as the initial 20–50 angstroms thickness of material deposited will function to protect the underlying semiconductor material from damage by energetic vaporized species. Obviously, in a roll-to-roll continuous deposition process, the bias would have to be maintained.

In the sputter deposition of a layer of indium tin oxide upon a silicon alloy photovoltaic cell generally similar to that of FIG. 1; it has been found that by utilizing an apparatus generally similar to the apparatus 30, illustrated in FIG. 2 and employing a ring-shaped member biased to a potential of approximately +80 volts, deposition rates of approximately 20 angstroms per second have been maintained without causing any noticeable damage to the semiconductor layers or degradation of photovoltaic device performance and indications are that still higher rates can be sustained. In contrast, an identical sputtering process not utilizing the biased member of the instant invention degraded the performance of the photovoltaic device noticably even when deposition rates of only 2-3 angstroms per second were maintained.

Figure 3:
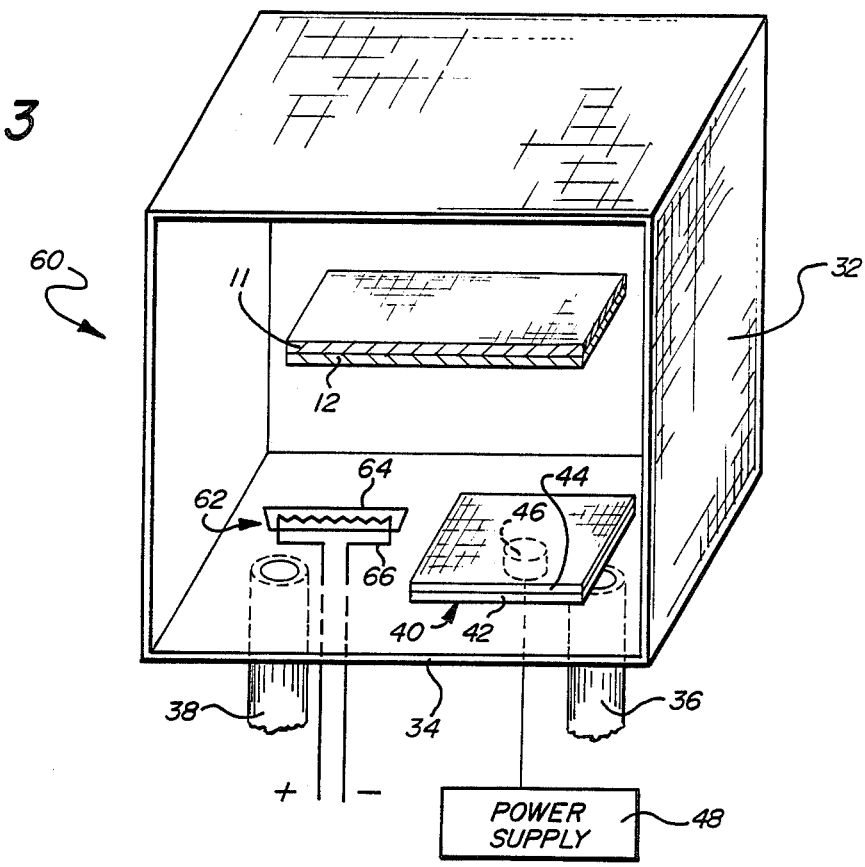
FIG. 3, is a stylized, perspective view of a plasma coating apparatus as modified in accord with a second preferred embodiment of the instant invention by the inclusion of means for providing a protective layer atop a semiconductor body prior to the sputter coating thereof; and, FIG. 4 is a schematic cross-sectional view, in elevation, of an apparatus structured in accord with the instant invention, said apparatus adapted to continuously plasma coat a layer of material atop a semiconductor body disposed upon an elongated, flexible web of substrate material as that substrate material advances through said apparatus.

Referring now to FIG. 3, there is shown another preferred embodiment of the instant invention disposed in a sputtering apparatus 60, generally similar to the apparatus 30 of FIG. 2; accordingly, like structures will be referred to by like reference numerals. Where the apparatus 60 of FIG. 3 difers from that of FIG. 2 is that it is adapted to provide a layer of protective material atop the semiconductor body 12 prior to the sputter coating thereof. Accordingly, the apparatus 60 includes a protective station 62 adapted to deposit a layer of protective material atop the semiconductor body 12. As illustrated, the protective station 62 includes a crucible 64 having an electrically energized resistance heater 66 attached thereto. The crucible 64 is adapted to thermally evaporate a layer of protective material onto the semiconductor layer 12 for preventing damage thereto by energetic species during the subsequent sputter coating process.

There are a wide variety of protective materials which may be employed, included among them are degenerate semiconductors, insulators, wide band gap semiconductors, cermets and various combinations thereof. The specific nature of the protective layer will depend upon the semiconductor material, the material being sputtered, and the particular type of device being fabricated. In cases where photoresponsive devices, such as photovoltaic devices are being fabricated, the protective layer should be reasonably transparent and have good electrical conductivity. In some instances, relatively high resistivity barrier layers are incorporated in various electronic devices for purposes of minimizing or preventing short circuit damage, regulating conductivity or other such purposes known and appreciated by those skilled in the art; and in such instances, the protective layer of the instant invention may be formed of insulating materials such as magnesium fluoride, silicon nitride, and the like.

In some instances, the protective layer may be formed of a material identical to the material of the subsequently sputter deposited layer, while in other instances the protective layer may be formed of a different material. Photoresponsive devices such as photovoltaic devices may include protective layers of material chosen from the group consisting essentially of indium oxide, tin oxide, indium tin oxide, cadmium oxide, cadmium stannate, zinc oxide, magnesium fluoride, silicon carbide, and combinations thereof.

In the practice of the FIG. 3 embodiment of the instant invention, a semiconductor body 12 disposed upon a substrate 11, both generally similar to that illustrated in and described with respect to FIG. 1, is disposed within the deposition chamber 32 of the apparatus 60. The crucible 64 is charged with indium tin oxide material and the chamber 32 is evacuated to a pressure within the range of $10^{-4}$–$10^{-5}$ Torr. The resistance heater 66 is energized so as to heat the crucible 64 and evaporate the indium tin oxide material therefrom. Heating, and low pressure are maintained until a layer of approximately 20 angstroms thickness of indium tin oxide is deposited upon the semiconductor body 12. Power to the resistance heater 66 is then terminated and pressure in the chamber 32 is raised to approximately $10^{-3}$ Torr by the introduction of argon thereinto.

At this point, the semiconductor layer 12 is protected by approximately 20 angstroms of indium tin oxide material, and the sputtering of the remainder of the indium tin oxide layer is implemented as in the foregoing description. The target 40 is energized via the power supply 48 so as to effect the sputtering process, which is sustained until approximately 550 angstroms of indium tin oxide is coated onto the semiconductor body 12.

Although the protective station 62 depicted in FIG. 3 is an evaporation station, various other methods may be employed to provide the protective layer. For example, protective stations may comprise a glow discharge deposition station, including an energized antenna or electrode adapted to develop a plasma from a process gas so as to effect the decomposition thereof and thereby deposit the protective layer. In other instances, the protective station may be a chemical vapor deposition station as is well known to those skilled in the art. In still other instances, the protective layer deposition station may comprise a sputtering station adapted to employ a low energy, low deposition rate sputtering process for providing the thin protective layer. In some instances where a low energy sputtering process is utilized to provide the protective layer, the target 40 and power supply 48 utilized for the high rate sputtering may also be employed for providing the protective layer by regulating the quantity and quality of power supplied to the target 40.

It should be noted that while FIG. 3 depicts the protective station 62 as being disposed within same chamber as the sputtering target 40, the step of depositing the protective layer may be carried out in a distinct apparatus, and/or at a point in time removed from that in which the high rate sputter coating is deposited. For example, the semiconductor body 12 may be provided with a protective layer as a final step in its preparation, and subsequently conveyed to another apparatus or station for the high rate sputter coating thereof.

Figure 4:
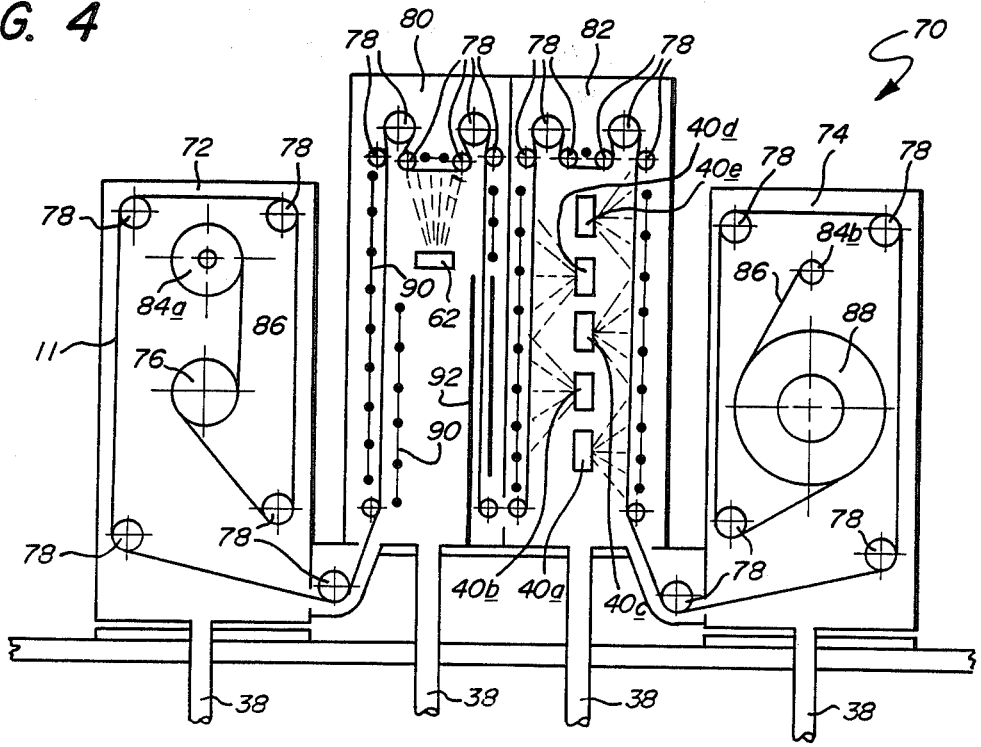

The instant invention may be readily adapted for a continuous mode of production wherein the semiconductor body is disposed upon an elongated, flexible web of substrate material which is conveyed through an apparatus for the continuous sputter coating thereof. Referring now to FIG. 4, there is shown one embodiment of such a preferred apparatus 70, which apparatus includes four chambers. A substrate payoff chamber 72 and a substrate take-up chamber 74 are adapted to retain and pay-off a web of substrate material 11 having a semiconductor body disposed thereupon. The pay-off chamber 72 includes a pay-off roller 76 and a series of turning rollers 78 adapted to direct the substrate 11 to the deposition chambers 80 and 82. It is generally preferred that the semiconductor coated web of substrate material 11 be protected by an interleaf member 86 formed of paper, cloth or polymeric material. The interleaf material 86 is interwound with the rolled substrate material 11 and functions to protect semiconductor surface thereof from abrasion. Accordingly, the pay-off chamber 72 includes an interleaf takeup roller 84a adapted to unwind the interleaf material 86 from the roll of substrate material on the pay-off roller 76. The take-up chamber 74 is generally similar to the pay-off chamber 72 and includes a take-up roller 88 adapted to store the coated substrate material. The chamber also includes a series of turning rollers 78 adapted to direct the substrate 11 therethrough. The take-up chamber 74 further includes an interleaf payoff roller 84b adapted to direct an interleaf member 86 onto the substrate take-up roller 88 so as to protect the coated surface as the substrate 11 is wound thereabout.

The remaining two chambers of the apparatus 70 are where the deposition of the transparent conductive material is actually carrie.d out. The first deposition chamber 80 is adapted to provide a thin protective layer upon the substrate as it passes therethrough and accordingly includes a protective layer deposition station 62 generally similar to the protective stations described hereinabove. The protective station 62 may be an evaporation station, a plasma glow discharge deposition station, chemical vapor depostion station, or a low energy sputtering station as described with reference to FIG. 3. The first deposition chamber 80 may include several banks of substrate heaters 90 adapted to maintain the web of substrate material 11 at an elevated temperature to facilitate deposition thereonto. Also shown are a plurality of turning rollers 78 adapted to guide the substrate therethrough, the use of such rollers being well known to those skilled in the art and need not be elaborated upon herein. The first deposition chamber 80 also includes a baffled passageway 92 adapted to interconnect with the second deposition chamber 82 so as to prevent cross contamination of the atmospheres in the two chambers and to assist in maintenance of differential pressures therein, in those instances where the processes in the two chambers are carried out at differing pressures.

The second deposition chamber 82 is adapted to plasma coat material, such as transparent conductive oxide material, upon the web of substrate material 11 as it passes therethrough and as illustrated includes a plurality of sputtering targets 40a–40e, it being understood that other processes such as glow discharge may be similarly utilized. It will be noted that a plurality of turning rollers 78 are utilized to guide the web of substrate material 11 through the second deposition chamber 82 in a generally U-shaped path of travel and the sputtering targets 40a–40e are disposed in an alternating orientation so as to maximize the area of the chamber productively utilized for sputtering. The second deposition chamber may also include several banks of heaters 90 for maintaining the desired substrate temperature.

It will be noted that each of the chambers 72, 80, 82 and 74 include an exhaust port 38 associated therewith for purposes of maintaining a reduced pressure in the apparatus 70. Each of the exhaust ports 38 may be connected to a vacuum pump or two or more of the ports may be manifolded to a single pump. In some instances it will be desirable to maintain differential pressures in the various chambers and this may be accomplished by utilizing different pumps for each chamber or by providing a throttle valve, not shown, associated with each of the exhaust ports 38 for maintaining the proper pressure therein. For example, in instances where the protective layer is deposited in the first chamber 80 by a vacuum evaporation process, it will be desirable to maintain the pressure within chamber 80 in the range of $10^{-4}$–$10^5$ Torr, whereas the sputtering process carried out in the second deposition chamber 82 is typically implemented at pressures of $10^{-3}$ Torr. In the pressure range employed for the evaporation, the mean free path of a typical gas molecule is approximately 50 centimeters; therefore, a baffling arrangement 92, such as that illustrated in FIG. 4 and being of a length exceeding the mean free path is sufficient to maintain the pressure differential between the two deposition chambers. In those instances where the deposition process carried out in the first coating chamber 80 does not require a pressure different from that of the second chamber 82, the baffles may be dispensed with.

Further modification of the apparatus 70 of FIG. 4 may be made in accord with the principles of the instant invention. For example, the first deposition chamber 80 may be eliminated and the sputtering station of the second chamber 82 modified to correspond with the FIG. 2 embodiment of the instant invention by the incorporation of at least one biased electrode member therein. Such a member could take the form of a grating or mesh configured and sized so as to be coextenxive with all of the sputtering targets 40a–40e or alternatively to be coextensive with the entirety of the web of substrate material 11 passing through the chamber. In other embodiments, the biased electrode may be associated with only a portion of the total sputtering target area because of the fact that the initial 20–50 angstroms of material deposited will function as a protective layer for the remaining deposition. In another variation of the instant invention, a protective layer may be provided by a low energy sputtering process, as detailed hereinabove. In such instances, a single one of the sputtering targets, for example target 40b, may be energized to a low power level and accordingly utilized to deposit the protective layer. The instant invention is directed to method and apparatus which employ protective means to prevent damage to semiconductor layers during the sputter coating thereof. Accordingly, many other modifications and variations of the methods and apparatus disclosed herein should be readily apparent to one skilled in the art.

While the instant invention has primarily been described with reference to the use of a sputtering process for the plasma deposition of material onto semiconductor layers, it should be kept in mind that other processes such as glow discharge deposition, reactive evaporation, photochemical processes and various chemical vapor deposition processes produce activated and energetic species which can damage semiconductor layers. The principles of the instant invention may be advantageously utilized in conjunction with all of such processes. Accordingly, the various embodiments of the instant invention, as depicted and described herein, are merely meant to be illustrative of the broad principles of the instant invention and are not meant to be limitations thereupon. It is the following claims, including all equivalents, which define the scope of the instant invention.

We claim:

1. A method of manufacturing a semiconductor device of the type including a layer of transparent, electrically conductive material in electrical communication with and in superposed relationship to a body of semiconductor material; said method including the steps of:
   providing said semiconductor body;
   depositing said layer of transparent conductive material in a two step process; the first step of the two step process comprises: depositing a layer of protective transparent conductive material atop the body of semiconductor material by a first set of deposition parameters, said protective material adapted to substantially prevent damage to the semiconductor body by energetic vaporized species developed during th esubsequent sputtering deposition of transparent conductive material;

and the second step of said two step process comprises: sputtering said transparent, conductive material atop the layer of protective material; said sputtering step differing in at least one material deposition parameter from the deposition parameters of said first set, whereby the transparent conductive material is coated upon the semiconductor body at a high rate of deposition without damaging said semiconductory body.

2. A method as in claim 1, wherein the first step of providing protective material includes:
providing means adapted to minimize energetic impact of preselected ionic species upon the semiconductor body.

3. A method as in claim 2, wherein: the second step of sputtering said layer of transparent, conductive material includes providing an energized sputtering target spacedly separated from the semiconductor body, said target and said body defining a vapor zone therebetween; and
the first step of providing means adapted to minimize ionic impact includes disposing an electrically biased member in the vapor zone.

4. A method as in claim 3, including the further step of positively biasing said member, whereby the energetic impact of negatively charged ions is minimized.

5. A method as in claim 4, wherein the step of positively biasing said member includes maintaining said biased member at a potential of +50 to +100 volts.

6. A method as in claim 3, wherein the first step of disposing an electrically biased member comprises disposing a screen-like member in the vapor zone.

7. A method as in claim 3, wherein the first step of disposing an electrically biased member comprises disposing a ring-like member in the vapor zone.

8. A method as in claim 2, wherein the second step of sputtering said layer of transparent, conductive material comprises sputtering a layer of a conductive metallic oxide material; and
the first step of providing means adapted to minimize ionic impact, includes providing means adapted to minimize the energetic impact of oxygen ions upon said semiconductor body.

9. A method as in claim 1, wherein the first step of providing said protective layer comprises evaporating said layer.

10. A method as in claim 1, wherein the first step of providing said protective layer comprises sputtering said layer in a low energy, low deposition rate process.

11. A method as in claim 1, wherein the first the step of providing said protective layer comprises depositing said protective layer by a plasma glow discharge process.

12. A method as in claim 1, wherein the first step of providing said protective layer comprises depositing said layer by a chemical vapor deposition process.

13. A method as in claim 1, wherein the first step of depositing said protective layer comprises depositing, in a process which does not damage the semiconductor body, a thin layer of said transparent conductive material prior to sputtering the remainder thereof.

14. A method as in claim 13, wherein the step of depositing said protective layer further comprises depositing at least 20 angstroms of a transparent conductive oxide prior to the sputtering deposition of the remainder of the layer of transparent conductive material.

15. A method as in claim 1, including the further step of selecting said protective material from the group consisting essentially of: indium oxide, tin oxide, indium tin oxide, cadmium oxide, cadmium stannate, zinc oxide, magnesium fluoride, silicon carbide, and combinations thereof.

16. A method as in claim 1, wherein the step of providing the semiconductor body includes providing the semiconductor body upon an elongated, flexible web of substrate material; and
the step of sputtering the transparent, conductive layer includes the further steps of: providing a sputtering apparatus having at least one plasma coating station therein, and continuously advancing said web through said sputtering apparatus whereby the transparent conductive layer is continuously deposited atop the layer of protective material.

* * * * *